United States Patent
Lee

(10) Patent No.: US 7,508,029 B2
(45) Date of Patent: Mar. 24, 2009

(54) SEMICONDUCTOR DEVICE AND METHOD FOR FABRICATING THE SAME

(75) Inventor: Sung-Kwon Lee, Kyounggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 17 days.

(21) Appl. No.: 11/706,912

(22) Filed: Feb. 13, 2007

(65) Prior Publication Data

US 2007/0148877 A1    Jun. 28, 2007

Related U.S. Application Data

(62) Division of application No. 11/262,222, filed on Oct. 28, 2005, now Pat. No. 7,199,013.

(30) Foreign Application Priority Data

Dec. 29, 2004   (KR) ...................... 10-2004-0115287

(51) Int. Cl.
*H01L 29/94* (2006.01)
(52) U.S. Cl. ...................... 257/327; 257/413
(58) Field of Classification Search ................. 257/347, 257/327, 413, 328–335
See application file for complete search history.

(56) References Cited

U.S. PATENT DOCUMENTS

| | | | | |
|---|---|---|---|---|
| 5,563,088 A | * | 10/1996 | Tseng | ......................... 438/253 |
| 6,107,157 A | | 8/2000 | Fazan et al. | ................. 438/424 |
| 6,743,669 B1 | * | 6/2004 | Lin et al. | ..................... 438/238 |

FOREIGN PATENT DOCUMENTS

| KR | 10-0223936 | 7/1999 |
|---|---|---|
| KR | 2002-0056289 | 7/2002 |
| KR | 2003-0014857 | 2/2003 |

* cited by examiner

*Primary Examiner*—Richard A. Booth
(74) *Attorney, Agent, or Firm*—Blakely Sokoloff Taylor & Zafman

(57) ABSTRACT

A semiconductor device capable of preventing a bridge generation during performing an etching process to form a plurality of gate structures on a substrate divided into an active region and a field region and an electrical short between a contact plug and the individual gate structure in the field region and a method for fabricating the same are provided. The semiconductor device includes: a substrate provided with an active region and a field region; a field oxide layer formed in the field region in such a way that the field oxide layer is recessed to be lower than a surface of the substrate disposed in the active region; and a plurality of gate structures formed on the field oxide layer and the substrate in the active region.

3 Claims, 4 Drawing Sheets

SEMICONDUCTOR DEVICE AND METHOD FOR FABRICATING THE SAME

The present patent application is a Divisional of application Ser. No. 11/262,222, filed Oct. 28, 2005 now U.S. Pat. No. 7,199,013.

FIELD OF THE INVENTION

The present invention relates to a semiconductor device and a method for fabricating the same; and more particularly, to a semiconductor device formed on a substrate provided with a field region and an active region and a method for fabricating the same.

DESCRIPTION OF RELATED ARTS

For a typical method for fabricating a semiconductor device, a field oxide layer or a device isolation layer is formed to divide a substrate into an active region and a field region. The field oxide layer is formed in a manner to have a different height from that of a substrate disposed in the active region. Accordingly, when a plurality of gate structures are formed on the substrate divided into the active region and the field region, the gate structures formed on the field oxide layer are formed more projected than the gate structures formed on the substrate in the active region. The projected gate structures formed on the field oxide layer cause a bridge and an electrical short between the individual gate structures and a contact plug supposed to be formed through a subsequent process.

FIG. 1 is a cross-sectional view illustrating a semiconductor device fabricated through a conventional fabrication method.

First, a gate oxide layer 12, a gate conductive layer 13 and a hard mask layer 14 are sequentially deposited on a substrate 10 provided with a plurality of field oxide layers 11. Afterwards, an etching process is performed, thereby forming a plurality of gate structures 15 on the substrate 10 divided into an active region A and a plurality of field regions B.

However, during performing the etching process, the conductive layer 13 formed on portions of the substrate 10 in the field regions B, i.e., on the field oxide layers 11, remain as remnants due to a height difference between a portion of the substrate 10 in the active region A and that of the substrate 10 in the individual field region B. A reference denotation C indicates the remnants of the conductive layer 13. Accordingly, the remnants become a factor for generating a bridge and in case of performing an excessive etching process to remove these remnants, a bottom portion of the substrate 10 can be damaged.

Subsequently, an insulation layer is formed over on the gate structures 15 and then etched to form a plurality of spacers 16 on sidewalls of the gate structures 15. Then, an inter-layer insulation layer 17 is formed over the above resulting structure. Afterwards, an etching process is performed to expose the substrate 10 in the active region A, so that the inter-layer insulation layer 17 remains only on the filed oxide layers 11.

Subsequently, a contact plug 18 is formed by depositing a conductive material such as polysilicon on the exposed substrate 10 in the active region A and filling gaps between the gate structures 15 in the active region A. At this time, the gate conductive layer 13 remaining as the remnants C as described above may induce an electric short with the contact plug 18.

SUMMARY OF THE INVENTION

It is, therefore, an object of the present invention to provide a semiconductor device capable of preventing a bridge generation during performing an etching process to form a plurality of gate structures on a substrate divided into an active region and a field region and an electrical short between a contact plug and the individual gate structure in the field region and a method for fabricating the same.

In accordance with one aspect of the present invention, there is provided a semiconductor device, including: a substrate provided with an active region and a field region; a field oxide layer formed in the field region in such a way that the field oxide layer is recessed to be lower than a surface of the substrate in the active region; and a plurality of gate structures formed on the field oxide layer and the substrate in the active region.

In accordance with another aspect of the present invention, there is provided a method for fabricating a semiconductor device, including: preparing a substrate provided with an active region and a field region by forming a field oxide layer; recessing the field oxide layer such that a top surface of the field oxide layer is lower than that of the substrate in the active region; forming a plurality of gate structures on the substrate including the recessed field oxide layer and the active region; and isolating the plurality of gate structures from each other by depositing an inter-layer insulation layer on a resulted structure provided with the plurality of gate electrodes.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

Hereinafter, detailed descriptions of preferred embodiments of the present invention will be provided with reference to the accompanying drawings.

Figure 1:
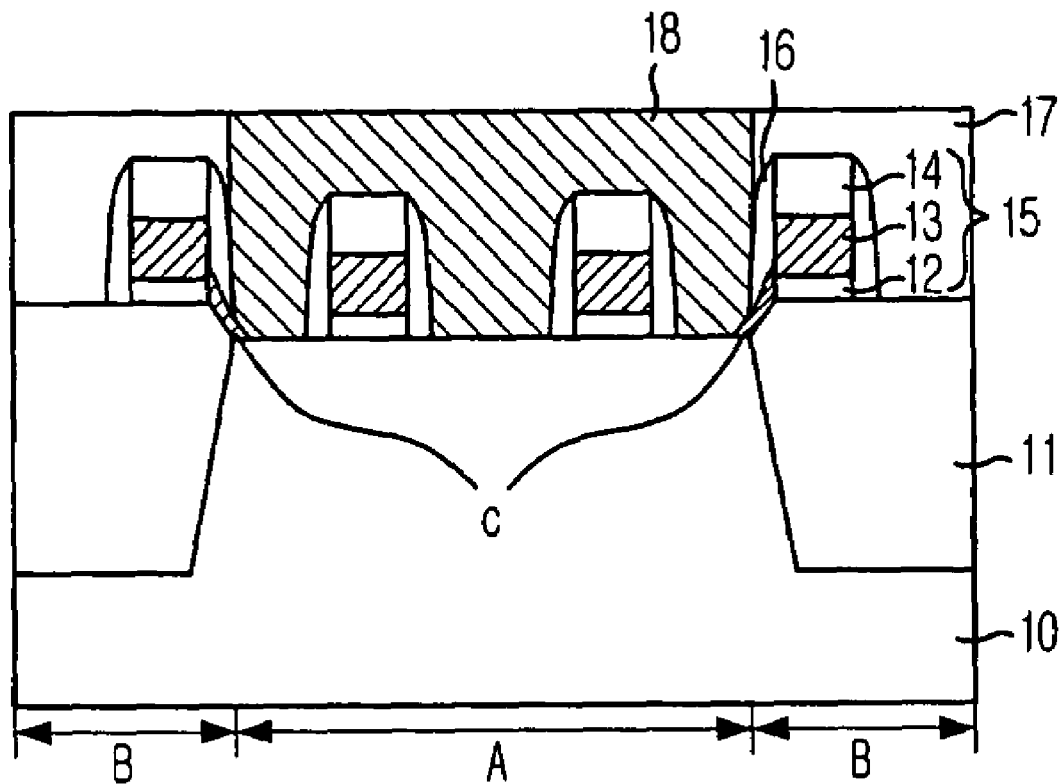
FIG. 1 is a cross-sectional view illustrating a semiconductor device fabricated by using a conventional method.
Figure 2:
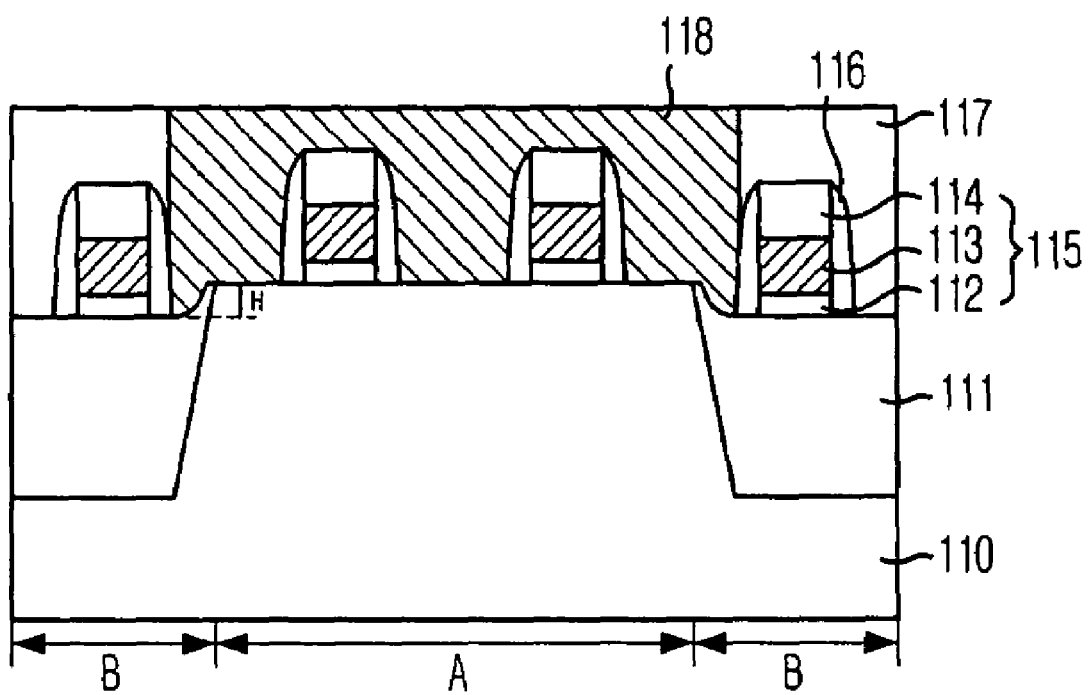
FIG. 2 is a cross-sectional view illustrating a semiconductor device in accordance with an embodiment of the present invention.

FIG. 2 is a cross-sectional view illustrating a semiconductor device in accordance with an embodiment of the present invention.

As shown in FIG. 2, the semiconductor device includes: a substrate 110 divided into an active region A and field regions B; a plurality of field oxide layers 111 formed in portions of the substrate 110 disposed in the field regions B and recessed in a predetermined depth H to be lower than a surface of the substrate 110 disposed in the active region A; a plurality of gate structures 115 formed on the substrate 110 in the active region A and on the field oxide layers 111; and a plurality of spacers 116 formed on sidewalls of the plurality of gate structures 115.

Furthermore, the above semiconductor device further includes: patterned inter-layer insulation layers 117 formed on the recessed field oxide layers 111 in a manner to cover the plurality of gate structures 115 disposed on the field oxide layers 111; and a contact plug 118 formed on the substrate 110 covering the plurality of gate structures 115 in the active region A.

At this time, each of the plurality of gate structures 115 includes a patterned gate oxide layer 112, a patterned gate conductive layer 113 and a hard mask 114. Although not illustrated, the patterned gate conductive layer 113 can be formed by stacking a tungsten layer or a tungsten silicide layer on a polysilicon layer.

Figure 3A:
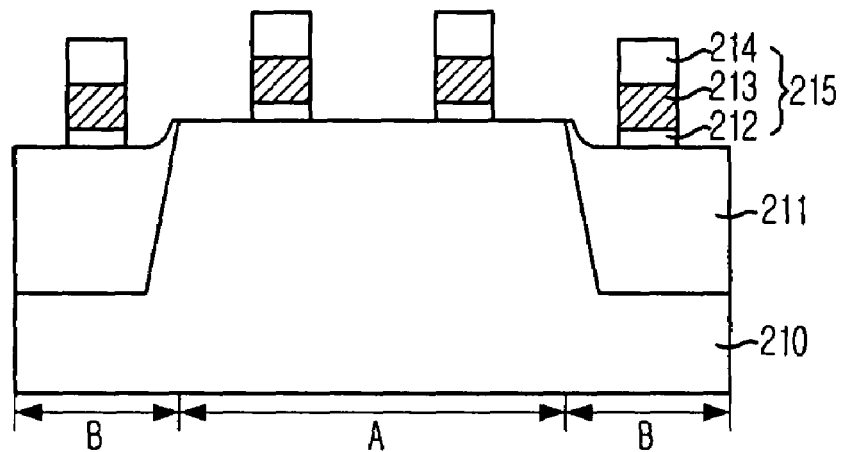
FIGS. 3A to 3C are cross-sectional views illustrating a method for fabricating a semiconductor device in accordance with the embodiment of the present invention.
Figure 3B:
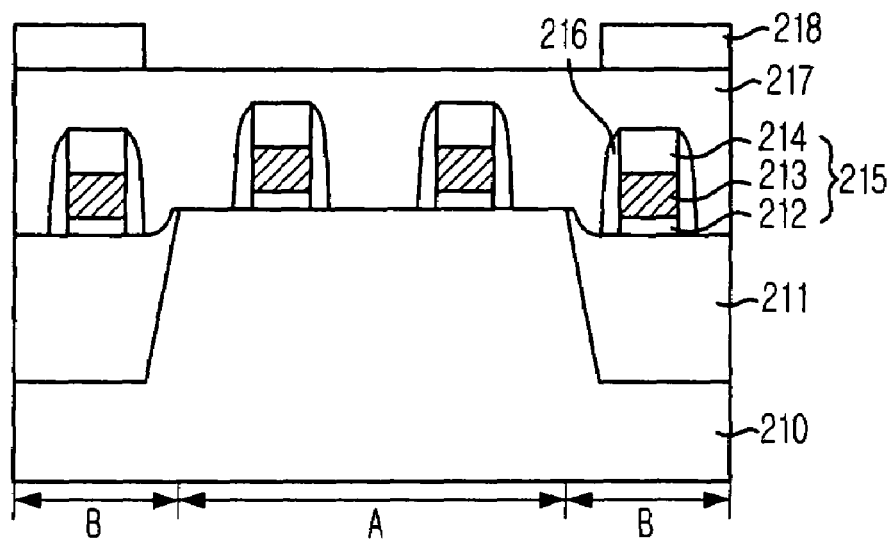
Figure 3C:
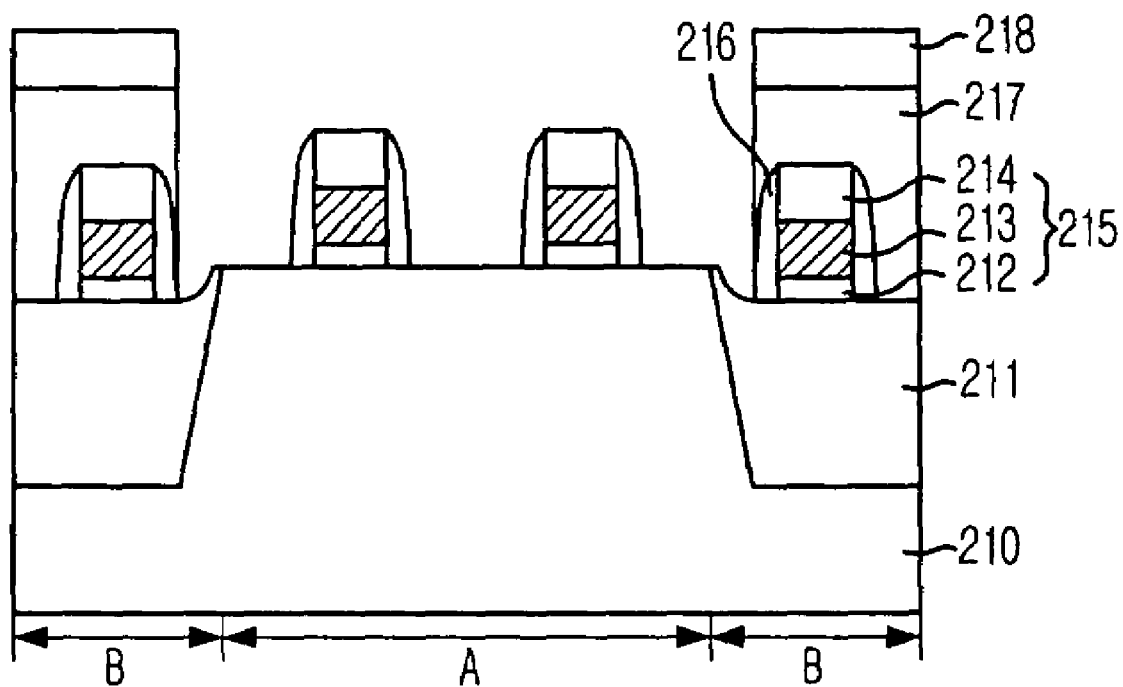

FIGS. 3A to 3C are cross-sectional views illustrating a method for fabricating a semiconductor device in accordance with the specific embodiment of the present invention. Herein, reference numerals used throughout FIGS. 3A to 3C indicate the identical constitution elements serving the identical roles.

As shown in FIG. 3A, trenches (not shown) are formed through a shallow trench isolation (STI) process in predetermined regions of a substrate 210. Then, a high density plasma (HDP) oxide layer filling the trenches is deposited. Thus, a plurality of field oxide layers 211 dividing the substrate 210 into an active region A and field regions B are formed.

Subsequently, a wet cleaning process is performed on certain portions of the substrate 210, whereby the field oxide layers 211 are recessed lower than a surface of the substrate 210 in the active region A, i.e., in a thickness ranging from approximately 150 Å to approximately 600 Å. At this time, the wet cleaning process is carried out by using a fluorine-based cleaning solution diluted in a ratio of approximately 1 of a fluorine-based solution to approximately 100 parts to approximately 1,000 parts of deoxidized water.

Also, a dry cleaning process can be performed to recess the field oxide layers 211. Herein, the dry cleaning process uses one of $CF_4$, $O_2$, $N_2H_2$ and Ar.

Subsequently, although not illustrated, a gate oxide layer, a gate conductive layer and a hard mask layer are sequentially deposited on the substrate 210 including the recessed field oxide layers 211. Then, the hard mask layer, the gate conductive layer and the gate oxide layer are sequentially etched, thereby forming a plurality of gate structures 215. Each of the gate structures 215 includes a patterned gate oxide layer 212, a patterned gate conductive layer 213 and a gate hard mask layer 214. During performing the etching process, it is possible to overcome a limitation that the patterned gate conductive layer 213 remains as remnants commonly produced when employing the conventional semiconductor device fabrication method due to the field oxide layers 211 that were previously recessed to be lower than the surface of the substrate 210 in the active region A.

Referring to FIG. 3B, an insulation layer (not shown) is deposited over the gate structures 215 and etched, thereby forming spacers 216 on sidewalls of the gate structures 215.

Subsequently, an inter-layer insulation layer 217 is deposited on the above resulting structure and thus, the plurality of gate structures 215 are electrically isolated. A contact mask 218 is formed on the inter-layer insulation layer 217 through using a photoresist pattern (not shown), which opens contact regions. At this time, the inter-layer insulation layer 217 is formed by using an oxide-based layer. For instance, the oxide-based layer selected from a group consisting of a high density plasma (HDP) oxide layer, a borophosphosilicate glass (BSG) layer, a phosphosilicate glass (PSG) layer, a plasma enhanced tetraethylorthosilicate (PETEOS) layer, an undoped silicate glass (USG) layer, a fluorinated silicate glass (FSG) layer, a carbon doped oxide (CDO) layer, and an organo silicate glass (OSG) layer can be used. In addition, an oxide-based layer having good fluidity can be used to form the inter-layer insulation layer 217.

Subsequently, as shown in FIG. 3C, a self-aligned contact (SAC) etching process using the contact mask 218 is performed to etch the inter-layer insulation layer 217. Thus, the active region A of the substrate 210 is exposed.

Subsequently, the contact mask 218 is removed by performing a strip process. Afterwards, although not shown, a conductive layer is formed on the above mentioned exposed substrate 210, filling gaps between the gate structures 215 in the active region A and then, the conductive layer is planarized at the same level as the inter-layer insulation layer 217. As a result, a contact plug connecting the substrate 210 in the active region A with upper metal layers, which will be formed later, is formed.

As described above, in accordance with the specific embodiment of the present invention, field oxide layers are formed by being recessed in a predetermined depth through a wet cleaning process and then, a plurality of gate electrodes are formed on the recessed field oxide layers. Thus, during performing an etching process to form the gate structures, it is possible to overcome a typically observed limitation in that a gate conductive layer remains as remnants.

Accordingly, it is possible to prevent a bridge generation and an electrical short between a contact plug formed through a subsequent process and the gate structures formed on the field oxide layers. Furthermore, there is an effect of increasing yields of semiconductor device.

The present application contains subject matter related to the Korean patent application No. KR 2004-0115287, filed in the Korean Patent Office on Dec. 29, 2004, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A semiconductor device, comprising:
    a substrate provided with an active region and a field region;
    a field oxide layer formed in the field region in such a way that the field oxide layer is recessed to be lower than a surface of the substrate in the active region; and
    a plurality of gate structures formed on the field oxide layer and the substrate in the active region,
    wherein the field oxide layer has a top surface at a center lower than that at an edge.

2. The semiconductor device of claim 1, wherein the field oxide layer is recessed in a thickness ranging from approximately 150 Å to approximately 600 Å.

3. The semiconductor device of claim 1, wherein the plurality of gate structures is formed by stacking a tungsten layer, a tungsten silicide layer or both on a polysilicon layer.

* * * * *